(12) United States Patent
Wu et al.

(10) Patent No.: US 12,052,933 B2
(45) Date of Patent: *Jul. 30, 2024

(54) SEMICONDUCTOR DEVICE

(71) Applicant: UNITED MICROELECTRONICS CORP., Hsin-Chu (TW)

(72) Inventors: Jia-Rong Wu, Kaohsiung (TW); Rai-Min Huang, Taipei (TW); I-Fan Chang, Tainan (TW); Ya-Huei Tsai, Tainan (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/132,992

(22) Filed: Apr. 11, 2023

(65) Prior Publication Data

US 2023/0247915 A1   Aug. 3, 2023

Related U.S. Application Data

(63) Continuation of application No. 16/930,291, filed on Jul. 15, 2020, now Pat. No. 11,665,978.

(30) Foreign Application Priority Data

Jun. 16, 2020 (CN) .......................... 202010546969.4

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/22* (2023.02); *H10N 50/01* (2023.02)

(58) Field of Classification Search
CPC ....... H10N 50/80; H01L 43/02; H01L 27/228; H01L 43/12
See application file for complete search history.

(56) References Cited

U.S. PATENT DOCUMENTS

| | | | |
|---|---|---|---|
| 9,040,405 B2 | 5/2015 | Hasche et al. | |
| 2004/0109349 A1* | 6/2004 | Nakajima | G11C 11/15 365/158 |
| 2008/0023740 A1* | 1/2008 | Horng | H01F 10/30 257/295 |
| 2008/0293165 A1* | 11/2008 | Ranjan | H10B 61/22 257/E21.001 |
| 2010/0059837 A1 | 3/2010 | Kim | |
| 2010/0295110 A1 | 11/2010 | Takaishi | |
| 2012/0028465 A1 | 2/2012 | Kosaka | |

(Continued)

FOREIGN PATENT DOCUMENTS

CN       102760688 A      10/2012
TW       201044460 A1     12/2010

*Primary Examiner* — Errol V Fernandes
(74) *Attorney, Agent, or Firm* — Winston Hsu

(57) ABSTRACT

The present invention provides a semiconductor device, the semiconductor device includes a metal interconnection on a substrate, in which a top view of the metal interconnection comprises a quadrilateral; and a magnetic tunneling junction (MTJ) on the metal interconnection, in which a top view of the MTJ comprises a circular shape, an area of the MTJ is smaller than an area of the metal interconnection.

7 Claims, 4 Drawing Sheets

(56) References Cited

U.S. PATENT DOCUMENTS

2014/0361352 A1 12/2014 Hung
2020/0313075 A1* 10/2020 Sato .................. G11C 11/161
2021/0391530 A1 12/2021 Chen

* cited by examiner

SEMICONDUCTOR DEVICE

CROSS REFERENCE TO RELATED APPLICATIONS

This application is a continuation application of U.S. application Ser. No. 16/930,291, filed on Jul. 15, 2020. The content of the application is incorporated herein by reference.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of: forming a first inter-metal dielectric (IMD) layer on a substrate; forming a first patterned mask on the first IMD layer, in which the first patterned mask includes a first slot extending along a first direction; forming a second patterned mask on the first patterned mask, in which the second patterned mask includes a second slot extending along a second direction and the first slot intersects the second slot to form a third slot; and forming a first metal interconnection in the third slot.

According to another aspect of the present invention, the present invention provides a semiconductor device, the semiconductor device includes a metal interconnection on a substrate, in which a top view of the metal interconnection comprises a quadrilateral; and a magnetic tunneling junction (MTJ) on the metal interconnection, in which a top view of the MTJ comprises a circular shape, an area of the MTJ is smaller than an area of the metal interconnection.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
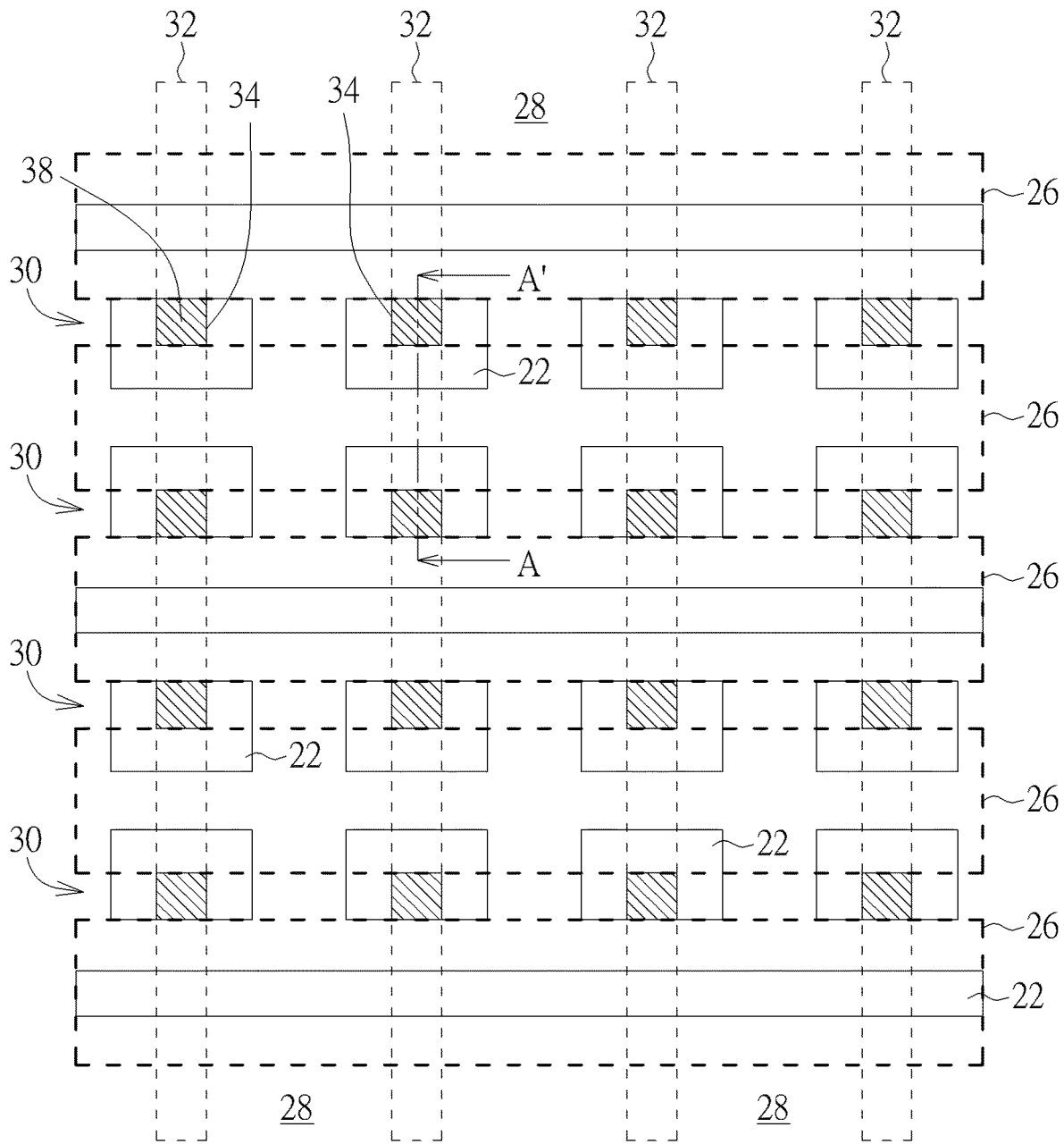
FIG. 1 illustrates a method for fabricating a MRAM device according to an embodiment of the present invention.
Figure 2:
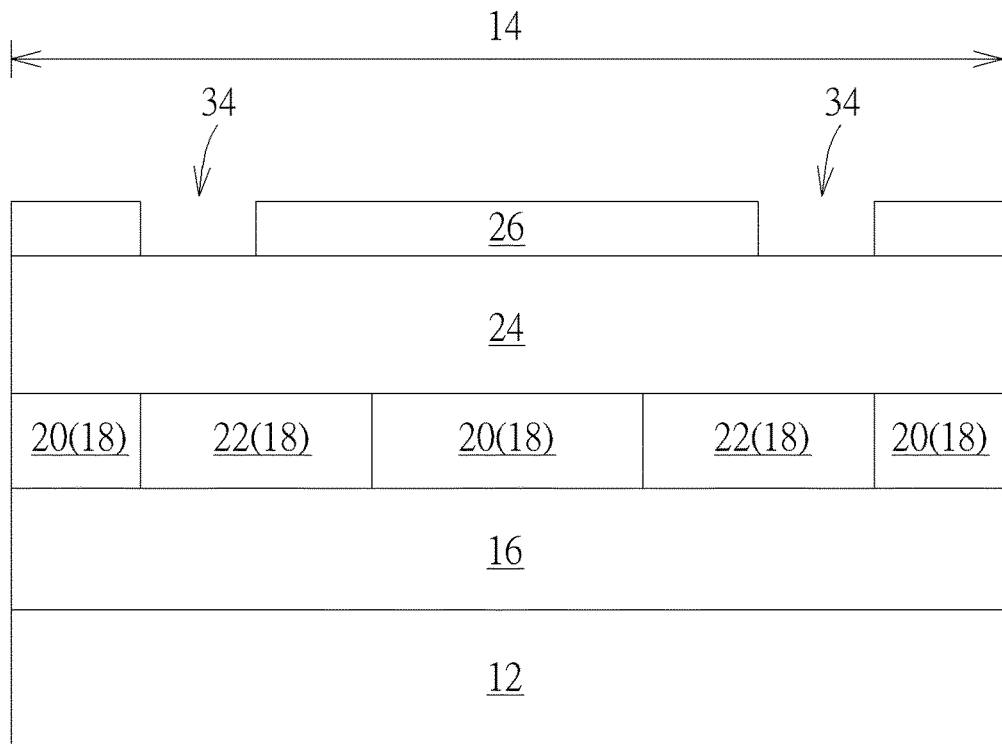
FIGS. 2-5 illustrate a method for fabricating the MRAM device along the sectional line AA' in FIG. 1 according to an embodiment of the present invention.

Referring to FIGS. 1-5, FIG. 1 illustrates a method for fabricating a semiconductor device, or more specifically a MRAM device according to an embodiment of the present invention and FIGS. 2-5 illustrate a method for fabricating the MRAM device along the sectional line AA' in FIG. 1 according to an embodiment of the present invention. As shown in FIGS. 1-2, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, a metal interconnect structure 18 is formed on the ILD layer 16 to electrically connect the aforementioned contact plugs, in which the metal interconnect structure 18 includes an inter-metal dielectric (IMD) layer 20, a selective stop layer (not shown), and metal interconnections 22 embedded in the IMD layer 20. In this embodiment, each of the metal interconnections 22 from the metal interconnect structure 18 preferably includes a trench conductor and each of the metal interconnections 22 could be embedded within the IMD layer 20 and/or stop layer according to a single damascene process or dual damascene process. For instance, each of the metal interconnections 22 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers in the metal interconnections 22 are preferably made of copper, the IMD layers 20 is preferably made of silicon oxide or ultra low-k (ULK) dielectric layer, and the stop layer could be made of nitrogen doped carbide (NDC), silicon nitride, silicon carbon nitride (SiCN), or combination thereof.

Next, an IMD layer 24 is formed on the IMD layer 20 and the metal interconnections 22, a first patterned mask 26 is formed on the IMD layer 24, and then a second patterned mask 28 is formed on the first patterned mask 26. In this embodiment, the first patterned mask 26 preferably includes a metal mask which could include titanium (Ti) and/or titanium nitride (TiN) while the second patterned mask 28 preferably includes a patterned resist.

It should be noted that the first patterned mask 26 is preferably made of a plurality of rectangular patterns extending along a first direction such as X-direction in FIG. 1 and the plurality of rectangular patterns of the first patterned mask 26 include a plurality of first openings or slots 30 therebetween also extending along the same first direction or X-direction, in which the edges of the first slots 30 are preferably aligned with the edges of the metal interconnections 22 embedded in the IMD layer 20 underneath. The second patterned mask 28 on the other hand is made of a plurality of rectangular patterns extending along a second direction such as Y-direction in FIG. 1 and the plurality of rectangular patterns of the second patterned mask 28 includes a plurality of second slots 32 therebetween, in which the second slots 32 are also extending along the same second direction such as Y-direction and intersecting the first slots 30.

Viewing from an overall perspective, portions constituted by rectangular dot lines extending along the X-direction in FIG. 1 are preferably the first patterned mask 26 while the portions also constituted by rectangular dot lines extending along the Y-direction are the second slots 32 of the second patterned mask 28. It should be noted that the rectangular first slots 30 and rectangular second slots 32 preferably intersect each other and the intersecting portions of the first slots 30 and second slots 32 preferably form a plurality of square third slots 34, in which each of the third slots 34 defines the position of another metal interconnect used for connecting the metal interconnection 22 and the edges of the third slots 34 are aligned with the edges of the metal interconnections 22 underneath.

Figure 3:
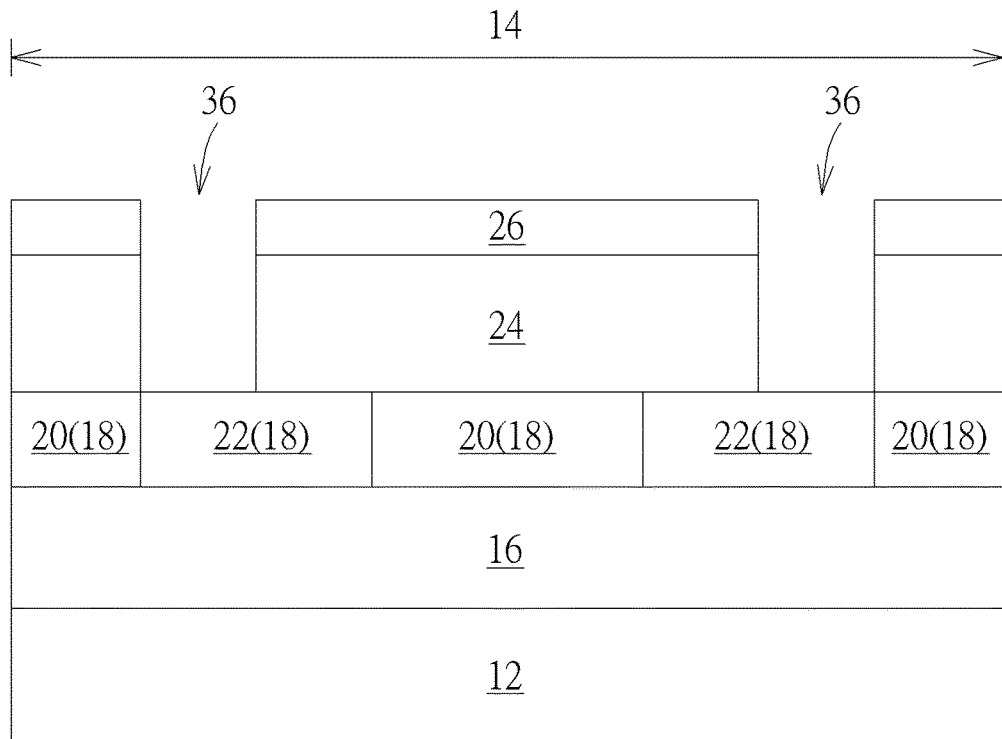

Next, as shown in FIG. 3, an etching process is conducted by using the first patterned mask 26 and the second patterned mask 28 as a mask at the same time to remove the IMD layer 24 within the third slots 34 for forming contact holes 36 exposing the metal interconnections 22 underneath. Since the contact holes 36 are essentially extensions of the third slots 34, the edges of the contact holes 36 are also aligned with the edges of the metal interconnections 22 underneath.

Figure 4:
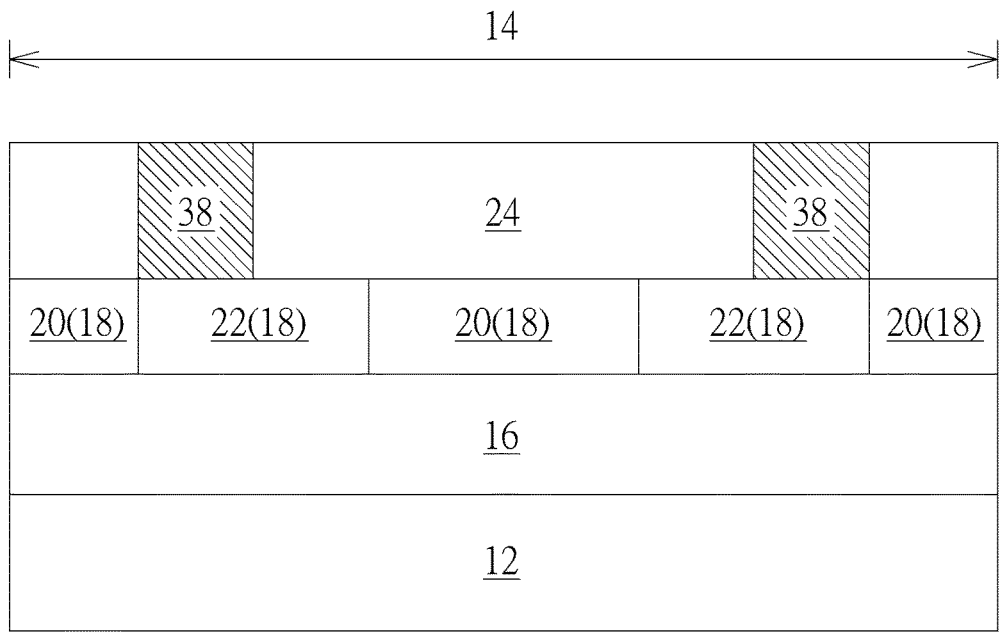

Next, as shown in FIG. 4, the second patterned mask 28 made of resist material is removed and conductive materials are deposited into the contact holes 36 thereafter. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes 36, and a planarizing process such as (chemical mechanical polishing, CMP) could be conducted to remove part of the conductive materials including the aforementioned barrier layer and metal layer to form a contact plugs or metal interconnections 38 in the contact holes 36 electrically connecting the metal interconnection 22.

Figure 5:
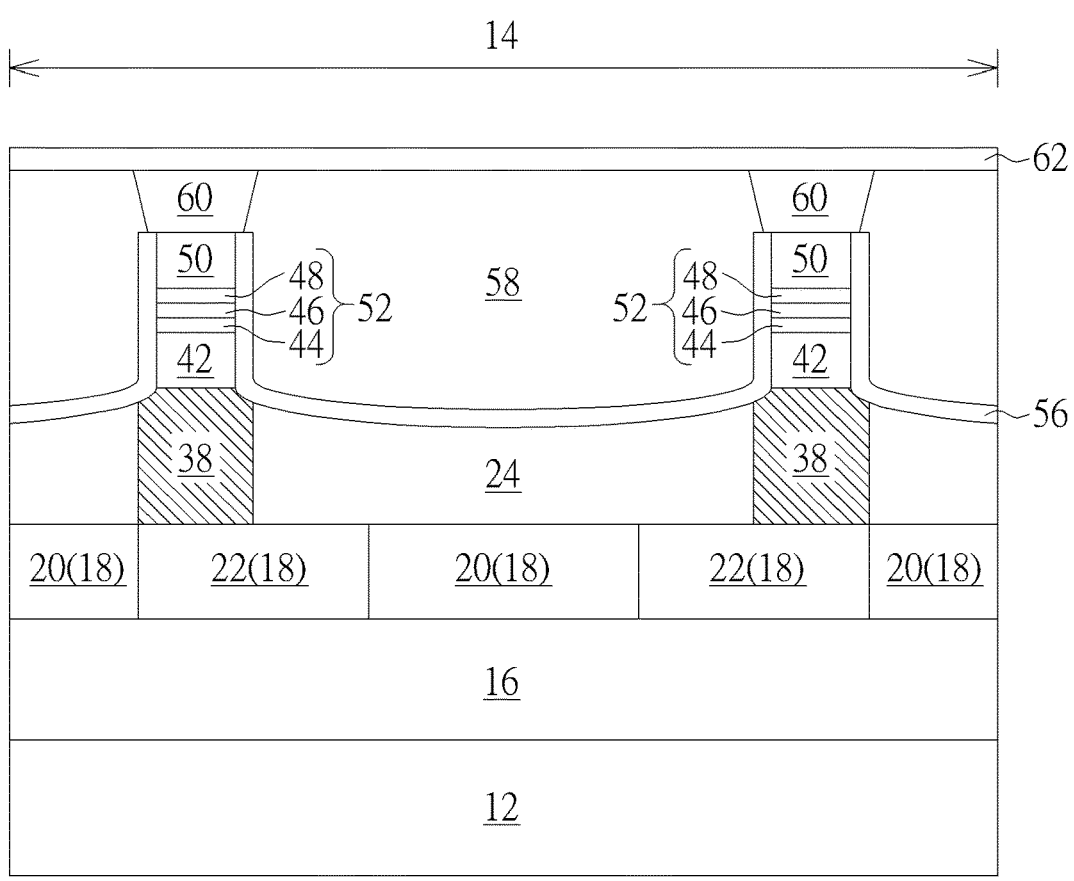

Next, as shown in FIG. 5, a MTJ stack (not shown) or stack structure is formed on the metal interconnections 38 and IMD layer 24. In this embodiment, the formation of the MTJ stack could be accomplished by sequentially forming a bottom electrode 42, a pinned layer 44, a barrier layer 46, a free layer 48, and a top electrode 50. In this embodiment, the bottom electrode 42 and the top electrode 50 are made of conductive materials including but not limited to for example tantalum (Ta), platinum (Pt), copper (Cu), gold (Au), aluminum (Al), or combination thereof. The pinned layer 44 could be made of ferromagnetic material including but not limited to for example iron, cobalt, nickel, or alloys thereof such as cobalt-iron-boron (CoFeB) or cobalt-iron (CoFe), in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB) or nickel-iron (NiFe), in which the magnetized direction of the free layer 48 could be altered freely depending on the influence of outside magnetic field.

Next, one or more etching process is conducted by using a patterned hard mask 110 as mask (not shown) to remove part of the MTJ stack for forming MTJs 52 on the metal interconnections 38, in which the bottom electrodes 42 are disposed under the MTJs 52 and top electrodes 50 are disposed on top of the MTJs 52. It should be noted that a reactive ion etching (RIE) process and/or an ion beam etching (IBE) process could be conducted to pattern the MTJ stack and due to the characteristics of the IBE process, the top surface of the remaining IMD layer 24 could be slightly lower than the top surface of the metal interconnections 38 after the IBE process and the top surface of the IMD layer 24 also reveals a curve or an arc.

Next, a cap layer 56 is formed on the MTJs 52 and covering the surface of the IMD layer 24, an IMD layer 58 is formed on the cap layer 56, and one or more photo-etching process is conducted to remove part of the IMD layer 58 and part of the cap layer 56 to form contact holes (not shown) exposing the top electrodes 50. Next, conductive materials are deposited into the contact holes and planarizing process such as CMP is conducted to form metal interconnections 60 connecting the top electrodes 50 underneath. Next, another stop layer 62 is formed on the IMD layer 58 and covering the metal interconnections 60.

In this embodiment, the cap layer 56 preferably includes silicon nitride, but could also include other dielectric material including but not limited to for example silicon oxide, silicon oxynitride (SiON), or SiCN depending on the demand of the product. The stop layer 62 could include nitrogen doped carbide (NDC), silicon nitride, silicon carbon nitride (SiCN), and most preferably SiCN. Similar to the aforementioned metal interconnections, the metal interconnections 60 could be formed in the IMD layer 58 according to a single damascene process or dual damascene process. For instance, each of the metal interconnection 60 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). This completes the fabrication of a semiconductor device according to an embodiment of the present invention.

Figure 6:
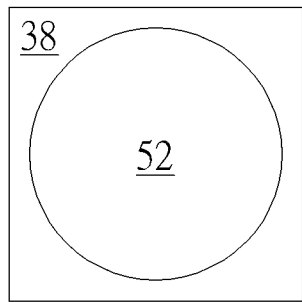
FIG. 6 illustrates a top view of the MTJ overlapping the metal interconnection in FIG. 5 according to an embodiment of the present invention.
Figure 7:
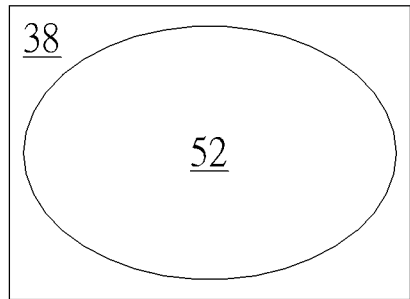
FIG. 7 illustrates a top view of the MTJ overlapping the metal interconnection in FIG. 5 according to an embodiment of the present invention.
Figure 8:
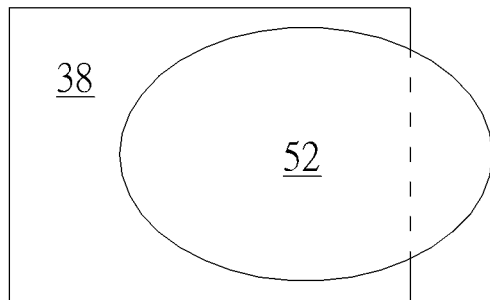
FIG. 8 illustrates a top view of the MTJ overlapping the metal interconnection in FIG. 5 according to an embodiment of the present invention.

Referring to FIGS. 6-8, FIGS. 6-8 illustrate top views of the MTJ 52 overlapping the metal interconnection 38 in FIG. 5 according to different embodiments of the present invention. As shown in FIGS. 6-7, the metal interconnection 38 made of tungsten is disposed on the MRAM region 14 while the MTJ 52 is dispose directly on top of the metal interconnection 38 and the bottom electrode 42 directly under the MTJ 52 contacts the metal interconnection 38 directly. Preferably, the metal interconnection 38 if viewed from a top view perspective includes a quadrilateral, a square, or a rectangular shape while the MTJ 52 includes a circular shape overlapping the square or rectangular shape of the metal interconnection 38 without contacting or passing over the edges of the square or rectangular shape.

Since the metal interconnection 38 is fabricated through the opening intersected by two patterned masks, the exterior profile or shape of the metal interconnection 38 could include a square shown in FIG. 6 or a rectangle shown in FIG. 7. On the other hand, the MTJ 52 is formed by an IBE process, the shape of the MTJ 52 preferably includes a circle shown in FIG. 6 or an ellipse shown in FIG. 7. It should be noted that even though the embodiment shown in FIG. 6 pertains to the combination of a square metal interconnection 38 pairing a circular MTJ 52 while the embodiment shown in FIG. 7 pertains to the combination of a rectangular metal interconnection 38 pairing an elliptical MTJ 52, according to other embodiments of the present invention it would also be desirable to interchange the shapes of the metal interconnection 38 and MTJ 52 for forming different combinations of the elements. For instance, it would be desirable to pair a square metal interconnection 38 with an elliptical MTJ 52 or a rectangular metal interconnection 38 with a circular MTJ 52 depending on the demand of the product, which are all within the scope of the present invention.

Next, as shown in FIG. 8, in contrast the MTJs 52 in FIGS. 6-7 are all disposed within the boundary of the metal interconnection 38 without overlapping or exceeding the boundary of the metal interconnection 38, it would also be desirable to adjust the size of MTJ 52 or shift the position of the MTJ 52 by overlapping at least an edge such as one side, two sides, three sides, or even four sides of the metal interconnection 38 with the MTJ 52, which are all within the scope of the present invention.

Overall, the present invention first forms an IMD layer on the substrate and then forms a first patterned mask on the IMD layer as the first patterned mask includes a first slot extending along a first direction. Next, a second patterned mask is formed on the first patterned mask, in which the second patterned mask includes a second slot extending along a second direction and the first slot intersects the second slot to form a third slot. Next a metal interconnection is formed in the third slot and a MTJ is formed on the metal interconnection thereafter. By using the aforementioned dual patterned mask to form a MRAM device it would be desirable to fabricate metal interconnection with much smaller pitch as process window and size of the memory device decreases.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first metal interconnection on a substrate, a second metal interconnection on the first metal interconnection, wherein a top view of the second metal interconnection comprises a quadrilateral, wherein a width of the second metal interconnection is smaller than a width of the first metal interconnection when viewed from a cross section view;
   an inter-metal dielectric layer disposed on the substrate, wherein the second metal interconnection is disposed in the inter-metal dielectric layer, and the inter-metal dielectric layer is a single layer structure; and
   a magnetic tunneling junction (MTJ) on the second metal interconnection, wherein a top view of the MTJ comprises a circular shape, wherein an area of the MTJ is smaller than an area of the second metal interconnection, and wherein a bottom surface of the second metal interconnection contacts the first metal interconnection directly.

2. The semiconductor device of claim 1, wherein the top view of the second metal interconnection comprises a square.

3. The semiconductor device of claim 1, wherein the top view of the second metal interconnection comprises a rectangle.

4. The semiconductor device of claim 1, wherein the second metal interconnection comprises tungsten (W).

5. The semiconductor device of claim 1, wherein the top view of the MTJ comprises a circle.

6. The semiconductor device of claim 1, wherein the top view of the MTJ comprises an ellipse.

7. The semiconductor device of claim 1, wherein the MTJ overlaps an edge of the second metal interconnection.

* * * * *